United States Patent
Sonoda

(10) Patent No.: US 6,440,614 B1
(45) Date of Patent: *Aug. 27, 2002

(54) MASK AND METHOD OF MANUFACTURING SEMICONDUCTOR DEVICE

(75) Inventor: Akihiro Sonoda, Tokyo (JP)

(73) Assignee: Oki Electric Industry Co, Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/431,033

(22) Filed: Nov. 1, 1999

(30) Foreign Application Priority Data

Nov. 11, 1998 (JP) .............................. 10-320630
Feb. 22, 1999 (JP) .............................. 11-042697

(51) Int. Cl.⁷ ................................................ G03F 9/00
(52) U.S. Cl. ........................................................ 430/5
(58) Field of Search ................. 430/5, 322; 716/19, 716/20, 21; 250/492.22

(56) References Cited

U.S. PATENT DOCUMENTS 5,302,477 A * 4/1994 Dao et al. ...................... 430/5
5,308,741 A * 5/1994 Kemp ........................ 430/312
6,103,428 A * 8/2000 Hatai et al. ..................... 430/5

FOREIGN PATENT DOCUMENTS

| JP | 58-078150 | 5/1983 |
| JP | 61-214559 | 9/1986 |
| JP | 06-037064 | 2/1994 |

* cited by examiner

Primary Examiner—S. Rosasco
(74) Attorney, Agent, or Firm—Rabin & Berdo, P.C.

(57) ABSTRACT

In order to provide a mask and a method for manufacturing a semiconductor device that achieve consistency in the resist pattern dimensions, a main pattern 110 provided for the purpose of semiconductor element production and an additional pattern 120 provided for the purpose of exposure quantity adjustment are drawn at a reticle 100. At the reticle 100, the additional pattern 120 achieves a regularity almost identical to that of the main pattern 110. At the same time, the additional pattern 120 has a specific shift relative to the main pattern 110. By achieving an optimal degree of shift between the additional pattern and main pattern at the reticle 100, consistency in the resist pattern dimensions can be achieved without adversely affecting the process of element pattern formation.

23 Claims, 10 Drawing Sheets

$110 = \{112\} \supset \{114, 116\}$ $120 = \{122\} \supset \{124, 126\}$

MASK AND METHOD OF MANUFACTURING SEMICONDUCTOR DEVICE

BACKGROUND OF THE INVENTION

The present invention relates to a mask and a method for manufacturing a semiconductor device.

In the lithography process in the prior art, a photoresist is first applied onto the front surface of a wafer, exposed with the main pattern for the mask by employing an exposure apparatus and then development is implemented to form a resist pattern on the wafer.

However, in photolithography implemented by utilizing excimer light, which is already adopted in mass production of semiconductor devices, the degree of transparency of the photoresist is increased to allow the excimer light to be transmitted. In addition, a shorter wavelength, as is the case with excimer light, causes the light reflectance of the lower layer film in the photoresist to increase. Consequently, even a minute difference in the energy of radiated light tends to affect the dimensions of the resist pattern more readily. In other words, a relative difference in the radiated light energy is present between an area where the pattern is dense and an area where the pattern is sparse.

As a result, there may be marked differences in the dimensions of elements in different portions of a resist pattern achieved through the lithography process in the prior art, resulting in the dimensions of the resist having partially deviating from the desired dimensional specifications. The radiated light energy in this context refers to the quantity of light radiated per unit area, and normally, it is expressed using the unit J(mJ). In addition, the dimensions of the pattern refer to the dimensions of pattern elements constituting the pattern.

FIGS. 9~12 illustrate the problem of the lithography process in the prior art discussed above. As shown in FIG. 9, the dimensions of elements in the outermost peripheral area are smaller than the dimensions of elements in the densely patterned area in a contact-hole pattern formed through the lithography process in the prior art. The data presented in FIG. 11 in regard to a contact pattern formed through the lithography process in the prior art substantiate the inconsistent formation of the contact pattern, as illustrated in FIG. 9. In addition, as shown in FIG. 10, in a line and space pattern formed through the lithography process in the prior art, the dimensions of elements in the outermost peripheral area are smaller than the dimensions in the densely patterned area due to the proximity effect. The data presented in FIG. 12 in regard to a line and space pattern formed through the lithography process in the prior art substantiate the inconsistent formation of the line and space pattern illustrated in FIG. 10.

SUMMARY OF THE INVENTION

An object of the present invention, which has been completed by addressing the problem of the lithography process in the prior art discussed above is to provide a new and improved mask and a new and improved method for manufacturing a semiconductor device, through which consistency in the dimensions of a resist pattern is achieved without adversely affecting other processes implemented on the wafer. Another object of the present invention is to provide a new and improved mask and a new and improved method for manufacturing a semiconductor device, through which consistency in the resist pattern dimensions is achieved without resulting in a reduction in throughput or an increase in cost.

Yet another object of the present invention is to provide a new and improved mask and a new and improved method for manufacturing a semiconductor device through which characteristics defects of semiconductor elements can be reduced and an improvement in the semiconductor device yield is achieved.

In order to achieve the objects described above, according to the present invention as defined in claims 1 through 3, the following structures are adopted in a mask employed in lithography, having a main pattern drawn thereupon with a specific arrangement, which is transferred onto a preset element formation area on a wafer and an additional pattern formed around the main pattern which adjusts the exposure quantity.

Namely, in the present invention as defined in claim 1, the additional pattern contains a shift pattern that manifests a specific quantity of shift relative to the main pattern. In the invention as defined in claim 1 adopting this structure, the quantity of exposure of the resist is adjusted by the additional pattern. In addition, in the invention as defined in claim 1, by achieving the adjustment over the specific degree of shift, the formation of the resist pattern in the area surrounding the preset element formation area on the wafer, which is attributable to the additional pattern, can be controlled without having to change the dimensions of the additional pattern.

Thus, according to the present invention as defined in claim 1, consistency in the dimensions of the resist pattern in the preset element formation area is achieved and, at the same time, any adverse effects that may manifest due to the presence of the additional pattern after the lithography process (e.g., formation of stages in the area surrounding the preset element formation area) can be suppressed. As a result, according to the present invention as defined in claim 1, an improvement in the lithographic precision is achieved without affecting the other processes implemented on the wafer so that a reduction in the characteristics defects of semiconductor elements and an improvement in the semiconductor device yield are achieved.

The exposure quantity in this context refers to the quantity of energy per unit area of light radiated on the resist which is a photosensitive material, in the area onto which the main pattern is transferred. In addition, the term "exposure quantity" is not necessarily used to refer to the quantity of light energy only, and it may be used to indicate the quantity of energy of any of various radiations such as x-rays, electron beams, ion beams or radioactive rays.

It is to be noted that as in the invention defined in claim 2, the shift pattern may assume a structure having an arrangement rule identical to that of the specific arrangement. The arrangement rule in this context refers to the rule adopted in arranging pattern elements in the pattern.

In addition, in the present invention as defined in claim 3, the additional pattern contains a frame pattern that surrounds the periphery of the main pattern. In the invention defined in claim 3, the exposure quantity for the resist is adjusted by the additional pattern containing the frame pattern. Unlike the main pattern, the frame pattern is simple and large.

Consequently, according to the invention as defined in claim 3, the problem of insufficient exposure quantity at the outermost peripheral area of the main pattern can be eliminated with a high degree of reliability. Furthermore, according to the invention as defined in claim 3, an inexpensive mask can be formed with ease. As a result, by adopting the invention as defined in claim 3, which achieves both a reduction in the manufacturing cost and an improvement in the lithographic precision, a reduction in the price of the semiconductor device is realized in addition to reducing characteristics defects of semiconductor elements and increasing the semiconductor device yield.

Also, in order to achieve the objects described above, according to the present invention as defined in claim 4, a mask that is utilized in lithography, having drawn thereupon at least a main pattern with a specific arrangement which is transferred onto a preset element formation area on a wafer, adopts a structure having an additional pattern for adjusting the exposure quantity drawn toward the inside relative to the main pattern in an area where the pattern is sparse. The area where the pattern is sparse in this context refers to an area where the element pattern is spread out such as, for instance, an outermost peripheral area of the pattern or an area where the pattern is isolated.

According to the invention defined in any of claims 1 through 4, the shape of the additional pattern can be designed by taking into consideration the effect on the wafer processing implemented before and after the lithography process. By designing the shape of the additional pattern in this manner, problems such as the element pattern being formed inaccurately, an extremely small margins in production and degradation in the element characteristics can be minimized.

Furthermore, according to the invention as defined in any of claims 1 through 4, the additional pattern can be designed to be formed at an optically appropriate position for exposure. By designing the additional pattern to be formed at an appropriate position in this manner, the dimensional differences in the pattern elements in dense areas and in sparse areas in the preset element formation area can be kept to a minimum.

Moreover, in order to achieve the objects described above, according to the present invention as defined in claim 5, a method for manufacturing a semiconductor device includes a lithography process which utilizes a mask as disclosed in any of claims 1, 2, 3 and 4. As explained above, since consistency in the dimensions of the resist pattern is achieved in the invention as defined in claims 1 through 4, the invention as defined in claim 5 provides a method for manufacturing a semiconductor device that achieves a reduction in characteristics defects of semiconductor elements and an improvement in the semiconductor device yield.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENT

The following is a detailed explanation of the preferred embodiments of the present invention, given in reference to the attached drawings. It is to be noted that in the following explanation and the attached drawings, the same reference numbers are assigned to components having identical functions and structural features to preclude the necessity for a repeated explanation thereof.

(First Embodiment)

Figure 1:
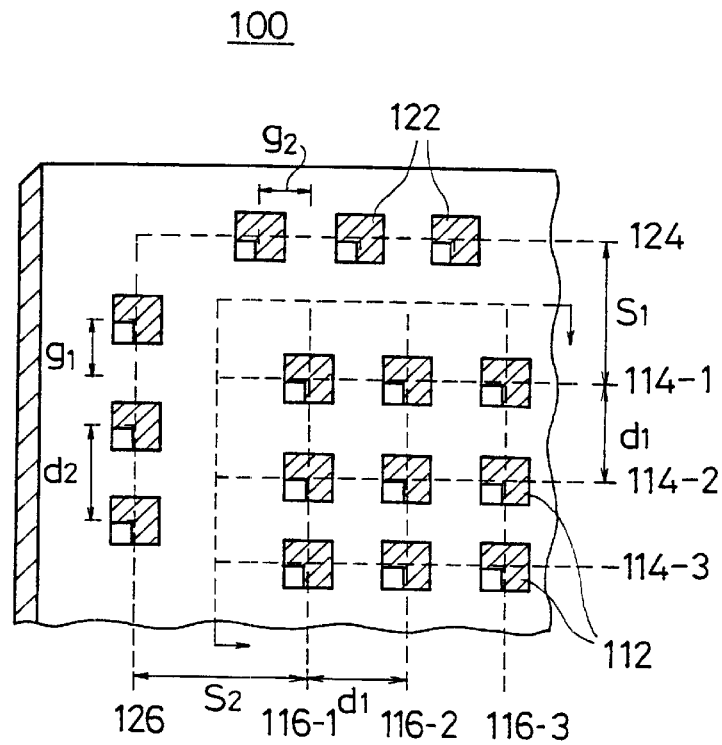
FIG. 1 partially and schematically illustrates the structure of a reticle that may adopt the present invention.
Figure 2:
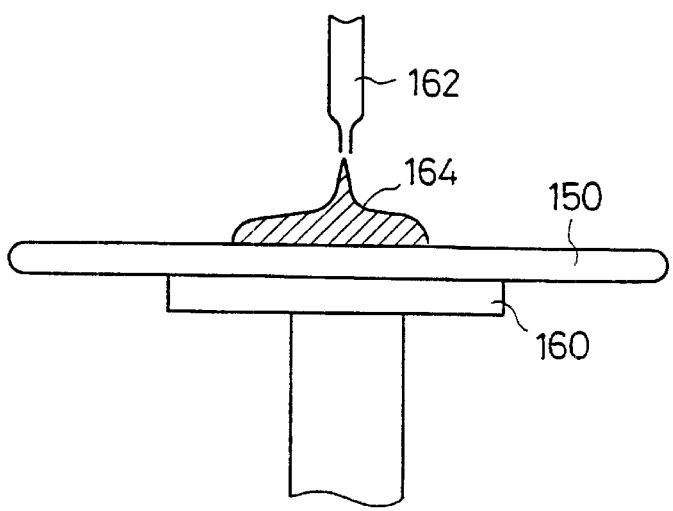
FIG. 2 illustrates a method for manufacturing a semiconductor device that may adopt the present invention.
Figure 3:
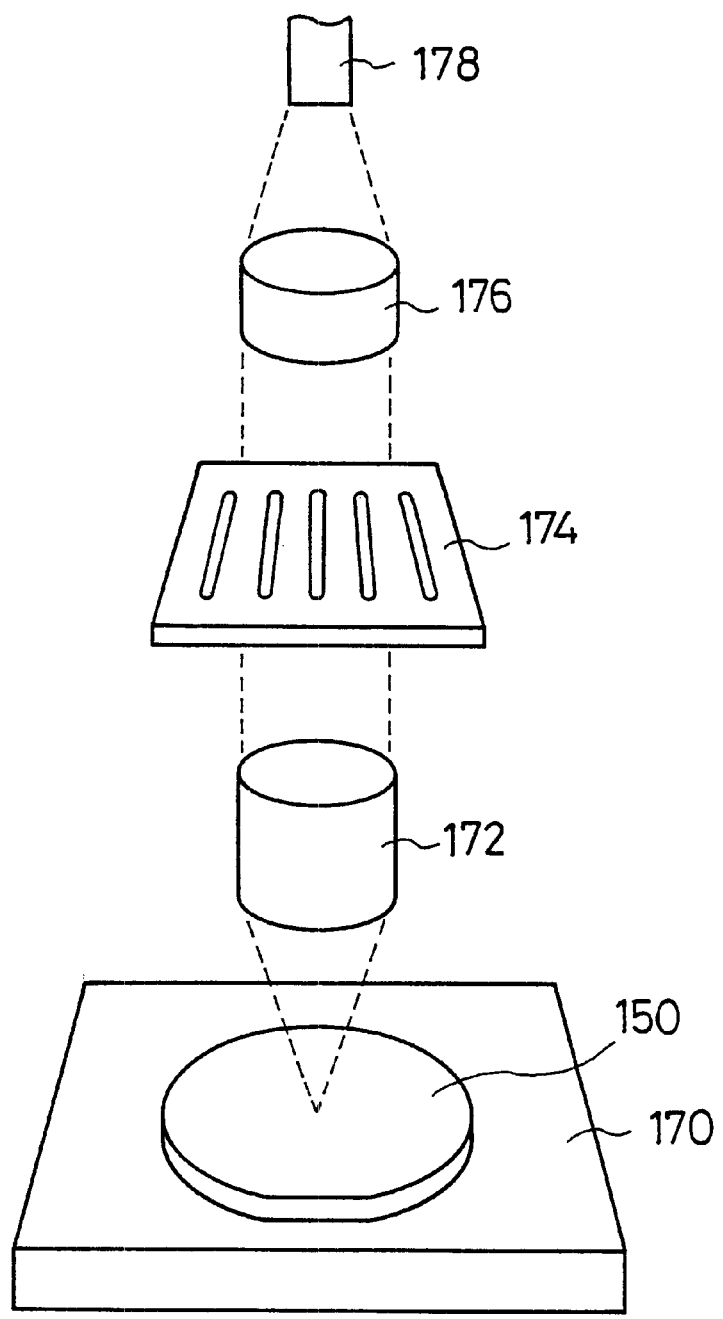
FIG. 3 is another illustration of the method for manufacturing a semiconductor device that may adopt the present invention.
Figure 4:
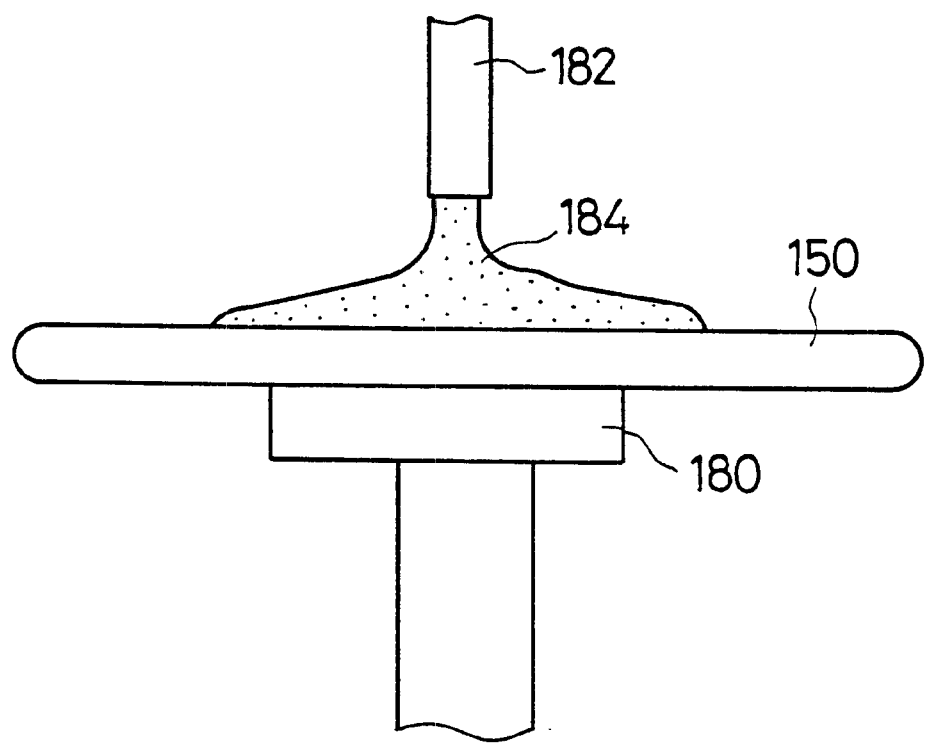
FIG. 4 is another illustration of the method for manufacturing a semiconductor device that may adopt the present invention.

First, in reference to FIGS. 1 through 4, the first embodiment is explained. It is to be noted that FIG. 1 partially and schematically illustrates the structure of a reticle 100 in the embodiment, with FIGS. 2–4 illustrating the method for manufacturing a semiconductor device adopted in the embodiment.

As illustrated in FIG. 1, the reticle 100 in the embodiment is a type of mask that may be adopted for use on an exposure apparatus such as, for instance, a stepper (step-and-repeat type projection exposure apparatus) or a photo-repeater. At the reticle 100 a main pattern 110 and an additional pattern 120 achieved by adopting the embodiment are drawn.

It is to be noted that the reticle 100 in the embodiment may be constituted by vapor-depositing chrome (Cr) on a glass plate. When the reticle 100 is constituted of such a material, the main pattern 110 and the additional pattern 120 can be formed through partial removal of the chrome. In addition, in the embodiment, either an exposure light transmission type pattern or an exposure light non-transmission type pattern may be selected as the main pattern 110 at the reticle 100, depending upon the type of resist (the negative type or the positive type) utilized in the photolithography process.

At the reticle 100, the main pattern 110 is drawn for the purpose of semiconductor element production. At the reticle 100, the main pattern 110, which is a contact-hole pattern, is constituted of main pattern elements 112 arranged over specific intervals d1 in an m (line)×n (row) matrix (m and n are positive integers). It is to be noted that FIG. 1 presents an enlargement illustrating the vicinity of a main pattern element 112-11 located at line 1, row 1. In the figure, the main pattern element 112-ij indicates a main pattern element 112 at line i, row j.

At the reticle 100, the additional pattern 120 is drawn for the purpose of adjustment of the exposure quantity. This additional pattern 120 is constituted of additional pattern elements 122 that are arranged over specific intervals d2 on the square periphery surrounding the outer edge of the main pattern 110.

In the additional pattern 120, a line 124 is formed from the additional pattern elements 122 that are provided roughly parallel to lines 114 of the main pattern 110. This line 124 is formed at a position that is away from the main pattern 110 (from the first line 114-1 or the mth line 114-m, to be more exact) by a specific distance SI. In addition, in the additional pattern 120, a row 126 is formed from the additional pattern elements 122 provided roughly parallel to rows 116 of the main pattern 110. This row 126 is formed at a position that is away from the main pattern 110 (from the first row 116-1 or the nth row 114-n to be more exact) by a specific distance S2.

In the embodiment, the additional pattern 120 assumes a regularity that is almost identical to that of the main pattern 110. Namely, the additional pattern elements 122 are formed in a shape and size that are almost identical to those of the main pattern elements 112, and furthermore, the intervals d2 between the additional pattern elements 112 that are adjacent to each other are set almost equal to the intervals d1 between the main pattern elements 112 that are adjacent to each other.

At the same time, the additional pattern 120 has a specific shift (or staggering) relative to the main pattern 110 in the embodiment. Namely, the individual additional pattern elements 122 constituting the line 124 are each formed at a position that is away from the extended line of the corresponding row 116 in the main pattern 110 by a specific distance g2, and the individual additional patter elements 122 constituting the row 126 are each formed at a position that is away from the extended line of the corresponding line 114 in the main pattern 110 by a specific distance g1. It is to be noted that the specific distance g1 and the specific distance g2 are each set in correspondence to the structure of the element pattern to be formed at the semiconductor device.

The reticle 100 structured as described above may be adopted in the method for manufacturing a semiconductor device in the embodiment that includes the lithography process explained next. The lithography process in the method for manufacturing a semiconductor device in the embodiment comprises an application step, an exposure step and a development step.

In the lithography process, the application step illustrated in FIG. 2 is first implemented. In the application step, a specific resist 164 which is supplied through a nozzle 162 is applied onto a wafer 150 placed on a spin-chuck 160 through spin-coating.

Next, the exposure step illustrated in FIG. 3 is implemented in the lithography process. In the exposure step, a specific type of light emitted from a light source 178 is radiated via a condenser lens 176, a mask 174 and a projection lens 172 onto the wafer 150 placed on a stage 170.

The wafer 150, the projection lens 172, the mask 174, the condenser lens 176 and the light source 178 are aligned so that the preset element formation area (not shown) of the wafer 150 is positioned accurately on a main optical path passing through a specific area of the mask 174. The main optical path in this context refers to an optical path of O-order diffracted light. In addition, such alignment may be achieved through global alignment, for instance.

As a result, through this exposure step, the pattern formed in a specific area of the mask 174 is precisely projected onto the resist 164 on the preset element formation area of the wafer 150.

During the exposure step, the reticle 100 in the embodiment which is illustrated in FIG. 1 may be utilized as the mask 174. When the reticle 100 is utilized in this manner, the main pattern 110 at the reticle 100 is set as the pattern formed at the specific area of the mask 174. In addition, in this case, the alignment is implemented by ensuring that the peripheral area of the preset element formation area on the wafer 150 is positioned on the main optical path passing through the additional pattern 120 at the reticle 100.

When the reticle 100 is employed to constitute the mask 174 as described above, the outermost peripheral area, which corresponds to an area where the pattern is sparse, and the inner area, which corresponds to an area where the pattern is dense, in the resist 164 (see FIG. 2) in the preset element formation area at the wafer 150 are exposed to light energy levels that are almost equal to each other.

Next, the development step illustrated in FIG. 4 is implemented in the lithography process. In the development step, a specific type of developing solution 184, which is supplied through a nozzle 182, is applied to the surface of the wafer 150 placed on the spin-chuck 180, onto which the resist has been applied, and then a specific type of processing such as inspection, baking or washing, is implemented to form a resist pattern at the wafer 150.

Needless to say, the method for manufacturing a semiconductor device in the embodiment may include various manufacturing processes such as, for instance, a crystal growth process, an oxidation process, a process to introduce impurities, a chemical vapor-deposition (CVD) process, a wiring process, an etching process, a cleaning process and the like, in addition to the photolithography process.

As explained above, in the semiconductor device manufacturing method in the embodiment, the resist applied to the entire preset element formation area of the wafer is exposed at an almost consistent level of light energy during the exposure step, regardless of location. Thus, the elements in the outermost peripheral area of the resist pattern and elements in the inner area of the resist pattern achieve practically identical dimensions in the resist pattern formed in the preset element formation area. In other words, by adopting the embodiment, stable dimensional specifications management of the resist pattern becomes possible. As a result, characteristics defects of semiconductor elements in the semiconductor device are prevented and the semiconductor device yield is improved through implementation of the embodiment.

In addition, the degree of shift of the additional pattern relative to the main pattern in the reticle in the embodiment is determined by taking into consideration the element design and the pattern structure. Namely, in the reticle in the embodiment, the degree of shift of the additional pattern relative to the main pattern can be determined by taking into consideration the normalcy of the formation of the resist pattern and the required margin in the formation of the resist pattern during a process preceding or succeeding the photolithography process, the possibility of degradation in the element characteristics and the like. Consequently, the resist pattern can be formed in a stable manner in the embodiment without adversely affecting the formation of the resist pattern during a preceding or succeeding process.

It is to be noted that when an additional pattern is formed at the mask, an unnecessary resist pattern is formed in the peripheral area of the preset element formation area at the wafer, which is attributable to the presence of the additional pattern. Normally, such an unnecessary resist pattern presents negative factors such as a cause for the formation of stages at the wafer surface when forming an element pattern in a succeeding process. However, with the reticle employed in the embodiment, by setting the quantity of shift of the additional pattern relative to the main pattern at a correct value, it is possible to ensure that such stages are formed at positions where they do not adversely affect the element pattern formation.

(Second Embodiment)

Figure 5:
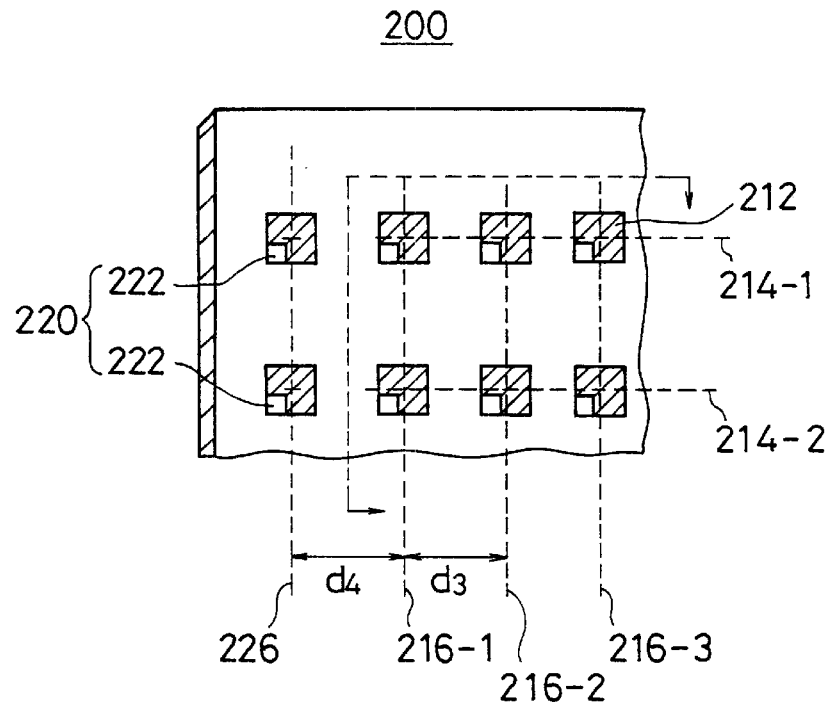
FIG. 5 partially and schematically illustrates the structure of another reticle that may adopt the present invention.
Figure 6:
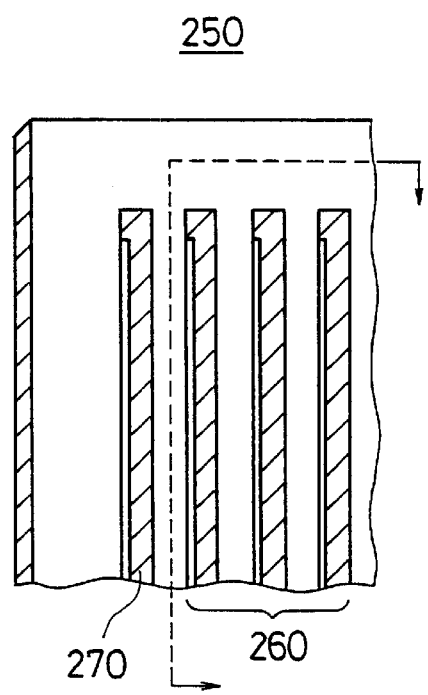
FIG. 6 partially and schematically illustrates the structure of yet another reticle that may adopt the present invention.

Next, in reference to FIGS. 5 and 6, the second embodiment is explained. It is to be noted that FIG. 5 partially and schematically illustrates the structure of a first reticle 200 in the embodiment, with FIG. 6 partially and schematically illustrating the structure of a second reticle 250 in the embodiment.

As illustrated in FIG. 5, the first reticle 200 in the embodiment is characterized by its additional pattern 220. However, the components of the reticle 200 in the embodiment other than the additional pattern 220 are almost identical to those of the reticle 100 in the first embodiment illustrated in FIG. 1. Thus, in the following explanation of the reticle 200, only the additional pattern 220 will be described in detail, with a detailed explanation of the other components omitted.

It is to be noted that this embodiment is characterized by an added pattern that is identical to the main pattern with the same regularity and is added on the outside of the main pattern. In other words, the embodiment is characterized in that a pattern repeating the same pattern as the main pattern is added for a specific number of repetitions on the outside of the outermost line or the outermost row of the main pattern.

As illustrated in FIG. 5, at the reticle 200, the additional pattern 220 is drawn for the purpose of exposure quantity correction. This additional pattern 220 is constituted of rows 226 of additional pattern elements 222 that enclose a main pattern 210 from the two outer sides (from the side where the first row 216-1 is present and from the side where the nth row 216-n is present).

The rows 226 of the additional pattern elements 222 are each away from the main pattern 210 (from the first row 216-1 or the nth row 216-n, to be precise) by a distance d4, which is almost equal to a distance d3 between adjacent main pattern elements 212. In addition, one additional pattern element 222 is formed at each side on the extended line of each line 214 (two additional pattern elements 222 are formed for each line 214).

As a result, the additional pattern 220 is added outside the main pattern 210 with the same regularity as that of the main pattern 210. In other words, at the reticle 200 in the embodiment, a pattern that is almost identical to a pattern achieved by extending the main pattern 210 along the direction of the lines 214 is formed.

When the reticle 200 described above is adopted in the method for manufacturing a semiconductor device in the first embodiment, too, the resist pattern in the outermost peripheral area and the resist pattern in the inner area in the preset element formation area at the wafer are exposed at light energy levels that are almost equal to each other, as is the case when the reticle 100 illustrated in FIG. 1 is utilized.

It is to be noted that this embodiment may be adopted for a reticle 250 illustrated in FIG. 6. As illustrated in FIG. 6, the reticle 250 is achieved by forming a main pattern 260 as a line and space pattern. In addition, an additional pattern 270, too, is formed as a line and space pattern, in combination with the main pattern 260 in the reticle 250.

When the reticle 250 described above is adopted in the method for manufacturing a semiconductor device in the first embodiment, too, the resist pattern in the outermost peripheral area and the resist pattern in the inner area in the preset element formation area at the wafer are exposed at light energy levels that are almost equal to each other, as is the case when the reticle 200 illustrated in FIG. 5 is utilized.

As explained above, in this embodiment, too, elements in the outermost peripheral area of the resist pattern and elements in the inner area of the resist pattern achieve practically identical dimensions in the preset element formation area at the wafer, as in the first embodiment explained earlier. Consequently, stable dimensional specification management of the resist pattern is possible, characteristics defects of the semiconductor elements are prevented and an improvement in the semiconductor device yield is achieved.

(Third Embodiment)

Figure 7:
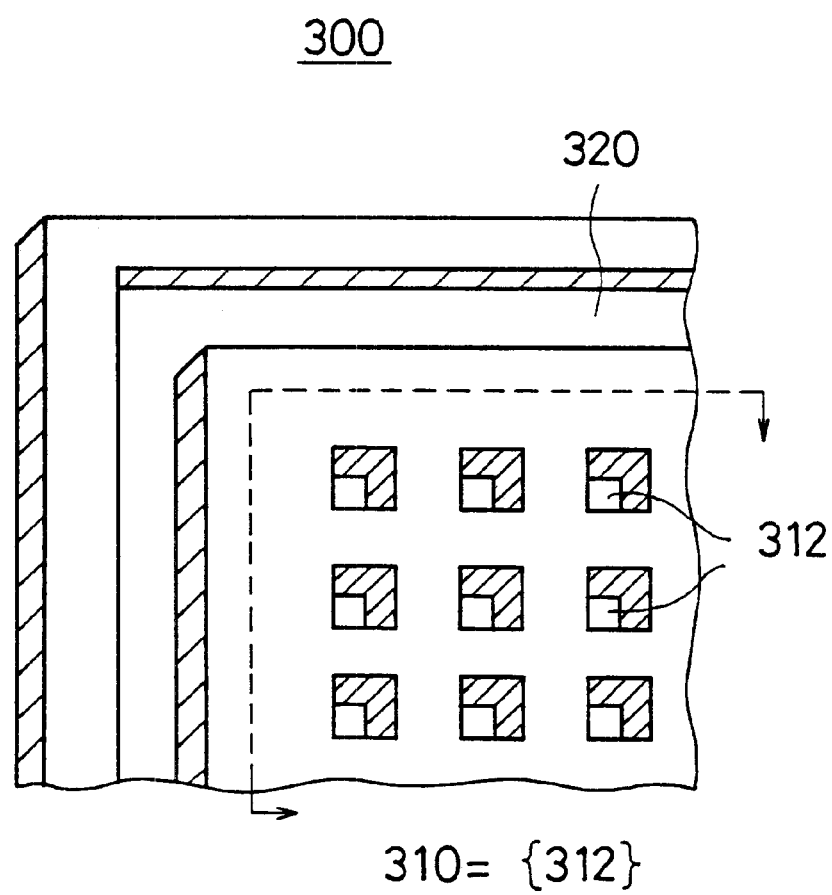
FIG. 7 partially and schematically illustrates the structure of yet another reticle that may adopt the present invention.

Next, in reference to FIG. 7, the third embodiment is explained. It is to be noted that FIG. 7 partially and schematically illustrates the structure of a reticle 300 in the embodiment.

As illustrated in FIG. 7, the reticle 300 in the embodiment is characterized by its additional pattern 320. However, at the reticle 300 in the embodiment, components other than the additional pattern 320 are almost identical to those of the reticle 100 in the first embodiment illustrated in FIG. 1. Therefore, only the additional pattern 320 is described in detail in the following explanation of the reticle 300, with a detailed explanation of other components omitted. It is to be noted that the embodiment is characterized by formation of a frame pattern provided on the outside of the main pattern, surrounding the main pattern.

As illustrated in FIG. 7, at the reticle 300, a frame-shaped additional pattern 320 is formed on the outside of the main pattern 310 along the four sides of the reticle 300. In other words, the additional pattern 320 in the embodiment is a frame-shaped pattern that surrounds the outside of the main pattern 310.

When the reticle 300 described above is adopted in the method for manufacturing a semiconductor device in the first embodiment, too, the resist pattern in the outermost peripheral area and the resist pattern in the inner area are in the preset element formation area at the wafer are exposed at light energy levels that are almost equal to each other, as is the case when the reticle 100 illustrated in FIG. 1 is utilized.

As explained above, by adopting the embodiment, the resist in the preset element formation area can be exposed evenly so that stable dimensional specifications management of the resist pattern is achieved as in the first embodiment. Thus, characteristics defects of the semiconductor elements in the semiconductor device are prevented and the semiconductor device yield is improved.

In addition, in this embodiment, a frame-shaped pattern is used as the additional pattern. Thus, the additional pattern is large and simple compared to the main pattern (which is normally ultrafine) in the embodiment. Consequently, the formation of the mask is facilitated in the embodiment.

Furthermore, since the additional pattern assumes a frame shape in the embodiment, the exposure quantity can be adjusted at a high radiating light energy level. As a result, the insufficiency in the exposure quantity can be effectively corrected in the outermost peripheral area of the preset element formation area in the embodiment.

(Fourth Embodiment)

Figure 8:
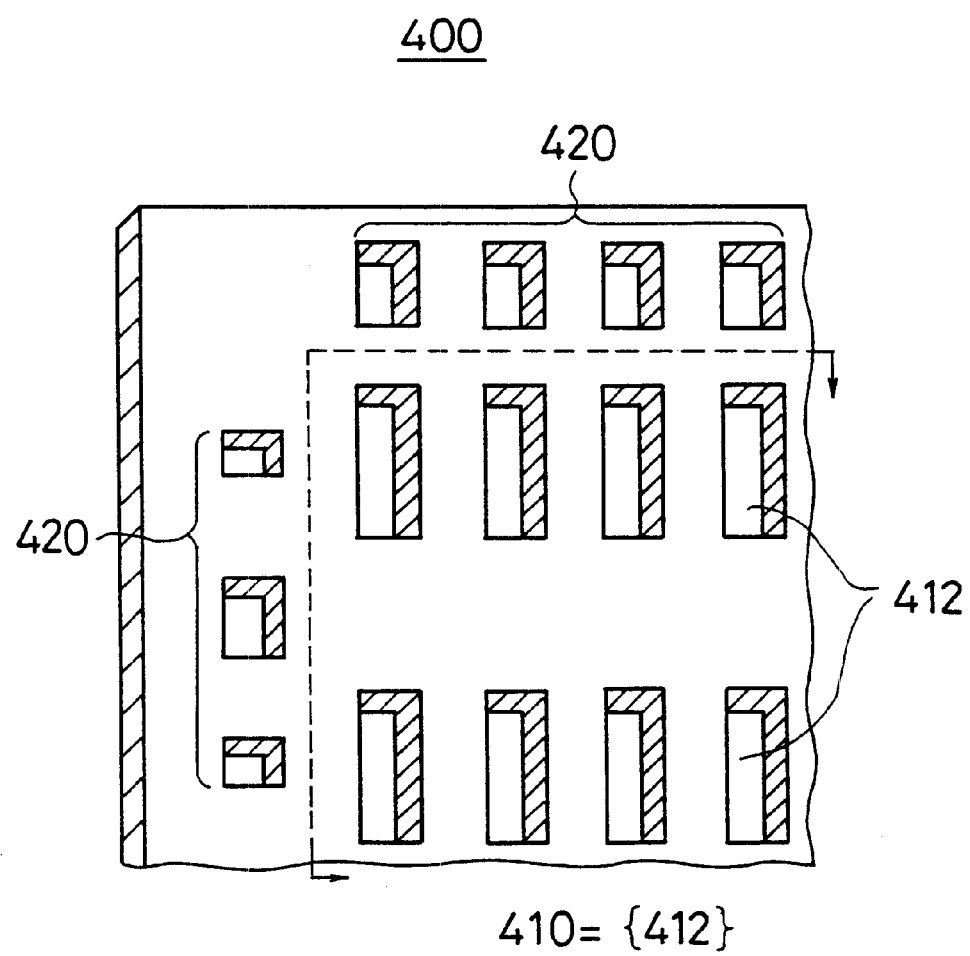
FIG. 8 partially and schematically illustrates the structure of yet another reticle that may adopt the present invention.
Figure 9:
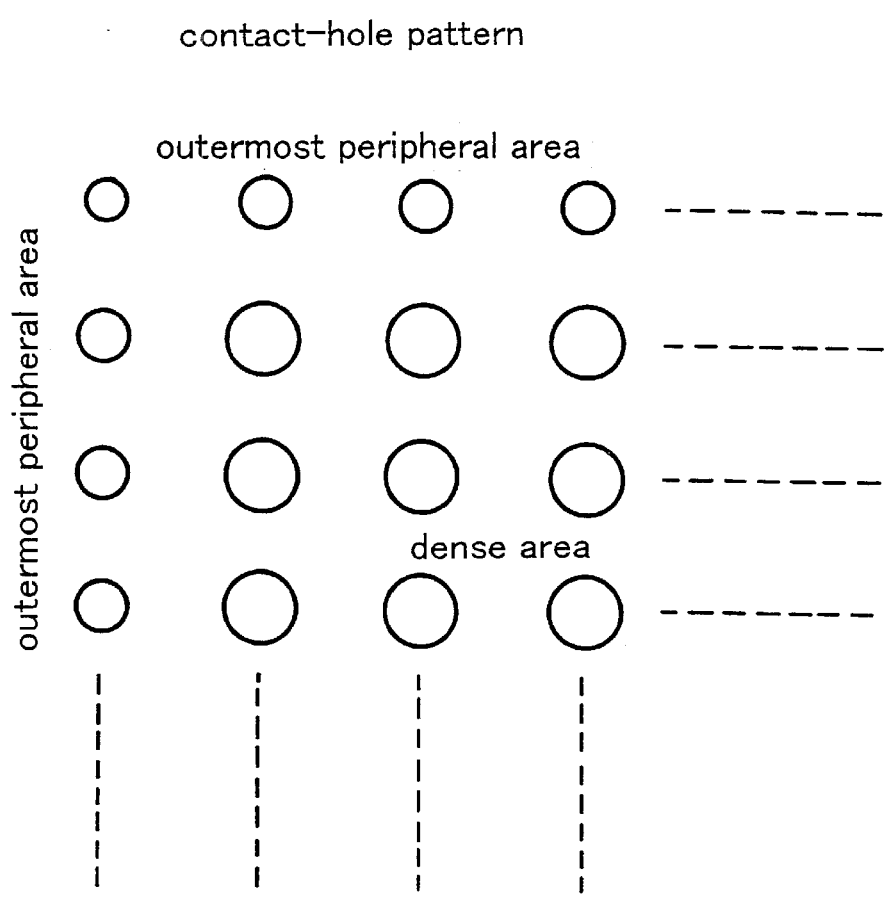
FIG. 9 presents an image that facilitates explanation of the problem of the lithography process in the prior art.
Figure 10:
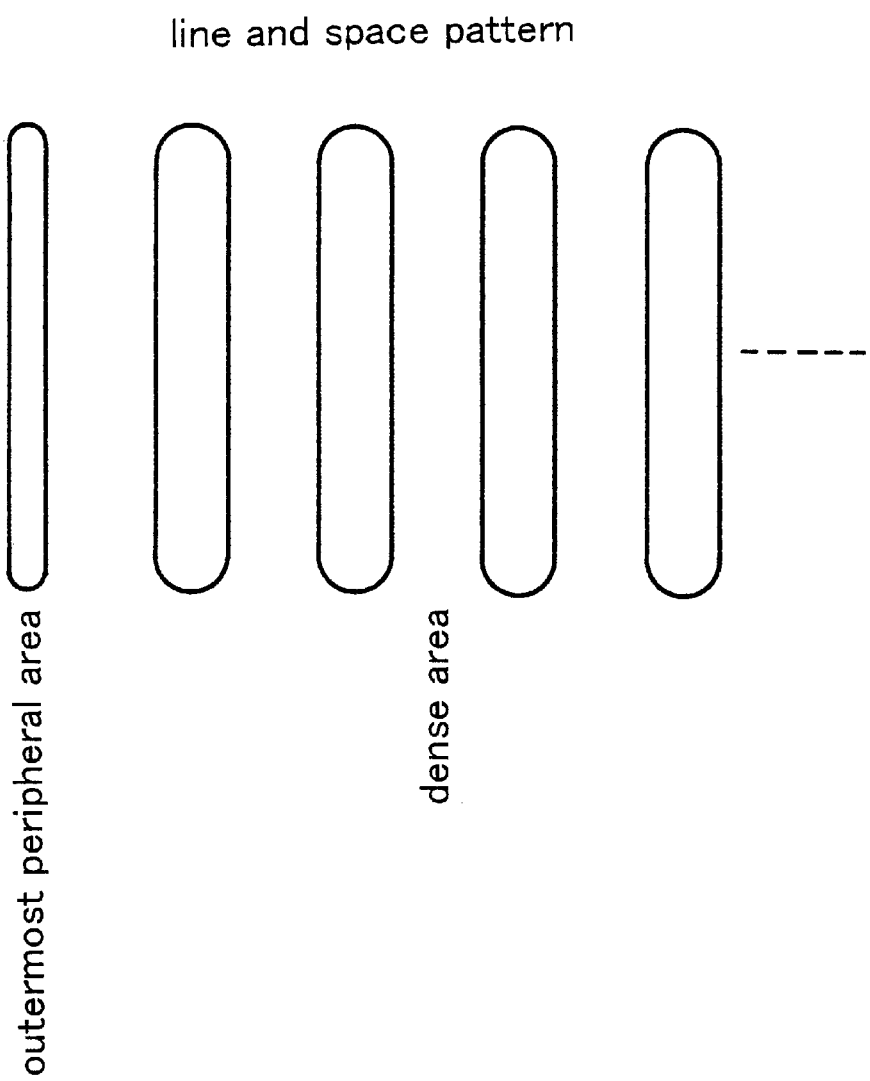
FIG. 10 presents another image that facilitates explanation of the problem of the lithography process in the prior art.
Figure 11:
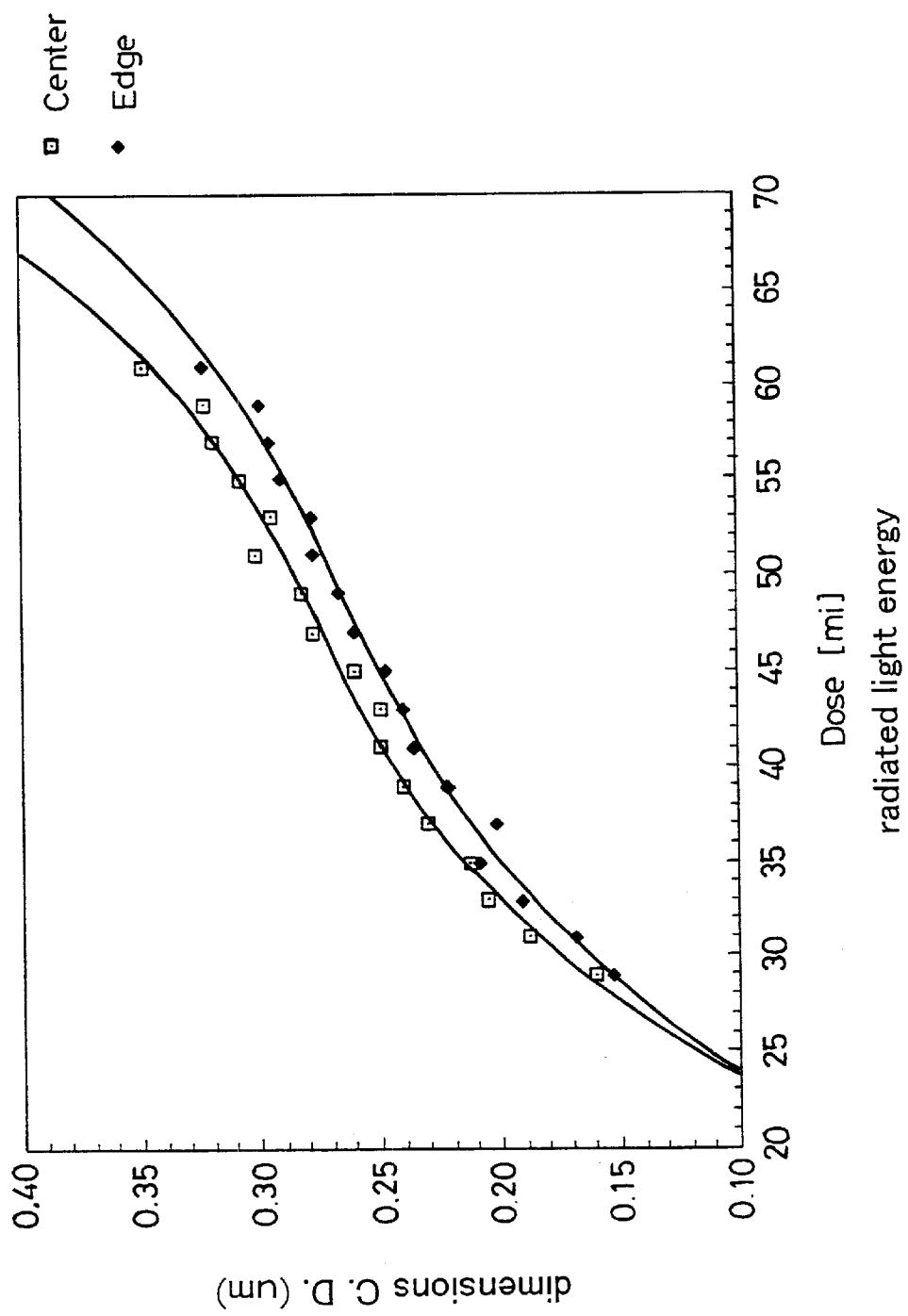
FIG. 11 presents data that substantiate the image presented in FIG. 9.
Figure 12:
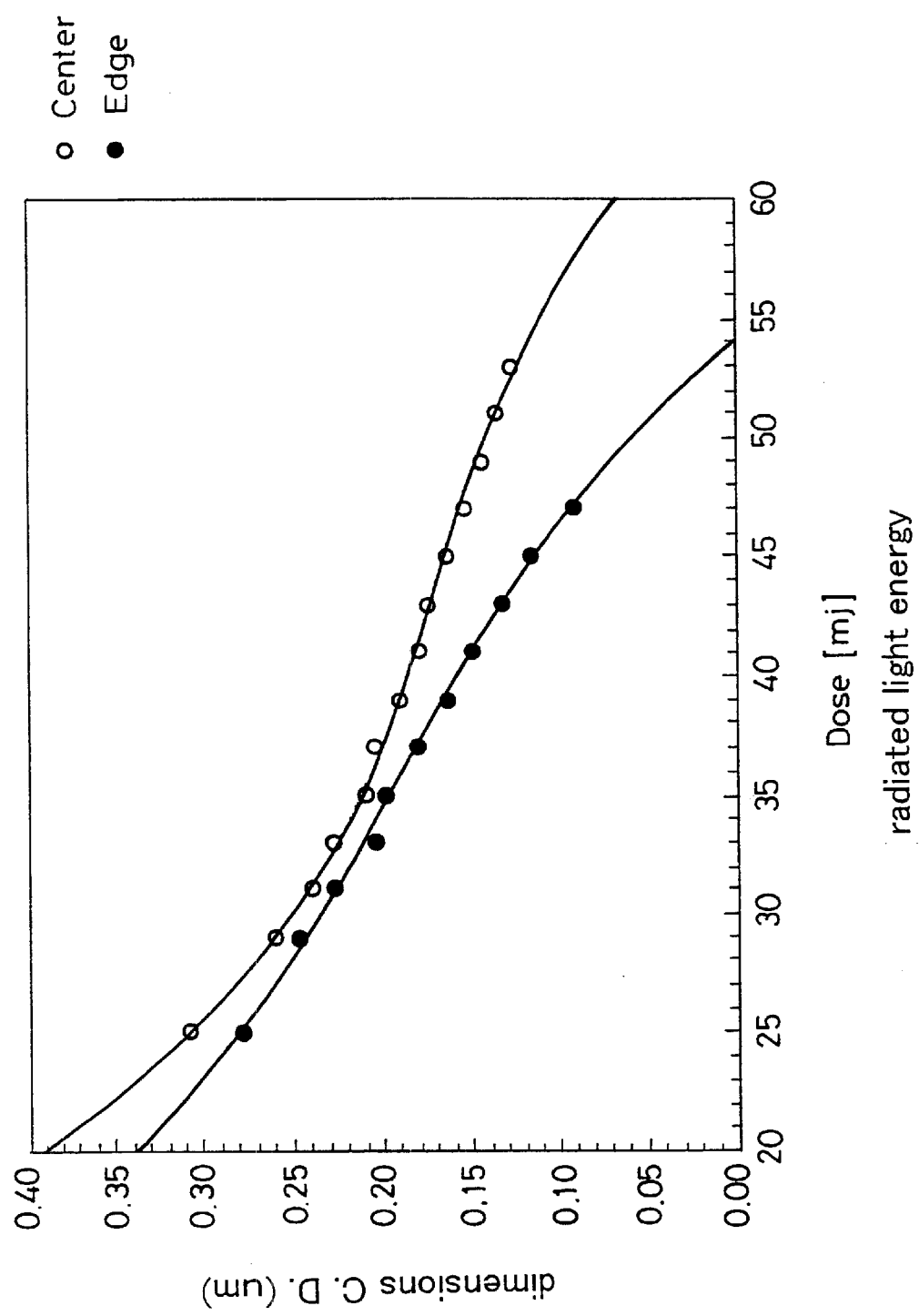
FIG. 12 presents data that substantiate the image presented in FIG. 10.

Next, in reference to FIG. 8, the fourth embodiment is explained. It is to be noted that FIG. 8 partially and schematically illustrates the structure of a reticle 400 in this embodiment.

As illustrated in FIG. 8, the reticle 400 in the embodiment is characterized by its additional pattern 420. However, the components of the reticle 400 in the embodiment other than the additional pattern 420 are almost identical to those of the reticle 100 in the first embodiment illustrated in FIG. 1. Thus, in the following explanation of the reticle 400, only the additional pattern 420 will be described in detail, with a detailed explanation of the other components omitted.

As illustrated in FIG. 8, the additional pattern 420 in this embodiment, which is provided on the outside of a main pattern 410, is designed by taking into consideration the optical requirements and the facilitation of the formation of the element design pattern structure (the formation of the pattern implemented during a process preceding or following the lithography process). In FIG. 8, the additional pattern 420 has pattern elements of varying sizes.

When the reticle 400 described above is adopted in the method for manufacturing a semiconductor device in the first embodiment, too, the resist pattern in the outermost peripheral area and the resist pattern in the inner area in the preset element formation area at the wafer are exposed at light energy levels that are almost equal to each other, as is the case when the reticle 100 illustrated in FIG. 1 is utilized.

As explained above, by adopting the embodiment, the resist in the preset element formation area can be exposed evenly so that stable dimensional specifications management of the resist pattern is achieved as in the first embodiment. Thus, characteristics defects of the semiconductor elements in the semiconductor device are prevented and the semiconductor device yield is improved.

In addition, in this embodiment, the exposure quantity at the outermost peripheral area of the preset element formation area is adjusted to reduce the degree of effect on the elements by shifting or distorting the additional pattern in consideration of eliminating any undesired effect on the process preceding or following the lithography process during which the pattern formation is implemented. Consequently, there is no risk of the pattern not being formed normally, of there being too little margin in the production and of degradation of the element characteristics in the embodiment.

Furthermore, since the additional pattern is designed to be present at all the locations where the optical requirements necessitate its presence in the mask in this embodiment, the dimensional difference occurring between a sparse area and a dense area can be reduced to an absolute minimum during the pattern formation at the outermost peripheral area of the preset element formation area.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the explanation is given on the embodiments above in which reticles utilizing chrome to constitute the light-blocking film are used, the present invention is not restricted to this structural example. According to the present invention, any of other various light-blocking films may be provided in the reticle, including those constituted of silicone or molybdenum silicide, those adopting a single-layer chrome film structure or a two- or three-layer chrome oxide film structure and those constituted of other metal films.

In addition, while the explanation has been given on examples in which reticles constituted of glass are utilized as masks in reference to the embodiments, the present invention is not restricted to these examples. The present invention may be adopted in a structure utilizing any of various other masks such as, for instance, an x-ray mask.

Furthermore, while the explanation has been given on the embodiments above which utilize reticles, the present invention His not restricted to this structural example. The present invention may be also adopted in structures utilizing various other masks such as master masks and working masks.

Moreover, while a contact-hole pattern or a line and space pattern is employed as the main pattern in the masks and the method for manufacturing a semiconductor device explained in reference to the embodiments, the present invention is not restricted to these examples. The present invention may be also adopted in a mask and a semiconductor device manufacturing method that uses any of various other main patterns.

In addition, while the masks achieved in the semiconductor device manufacturing method that employs an excimer laser stepper for the stepper have been explained as examples in reference to the embodiments above, the present invention is not restricted to these examples, and it may be adopted in masks achieved in a semiconductor device manufacturing method employing various other steppers such as a g-line stepper and an i-line stepper.

Furthermore, while the masks achieved in a semiconductor device manufacturing method that employs a step-type lens projection exposure apparatus for the exposure apparatus have been used as examples in the explanation of the embodiments above, the present invention is not restricted to these examples, and the present invention may be adopted in masks achieved in semiconductor device manufacturing methods employing various other exposure apparatuses including a scanning-type projection exposure apparatus and a scanning-step projection exposure apparatus or exposure apparatus other than lens type projection exposure apparatuses including a mirror type projection exposure apparatus and a mirror lens projection exposure apparatus.

Moreover, while the mask and the semiconductor manufacturing method that are achieved through adoption of photolithography as the lithography process have been explained in reference to the embodiments above, the present invention is not restricted to this example, and the present invention may be adopted in masks and semiconductor manufacturing methods that are achieved through adoption of various other lithography processes including ultraviolet ray lithography, electron beam lithography, ion beam lithography, x-ray lithography, radioactive ray lithography and laser lithography.

Also, while the mask and the semiconductor device manufacturing method that are achieved by adopting the spin-coating method for the resist application in the lithography process have been explained in reference to the embodiments above, the present invention is not restricted to this example, and it may be also adopted in masks and semiconductor device manufacturing methods achieved by adopting various other resist application methods during the lithography process, including the roller-coating method.

In addition, while the mask and the semiconductor device manufacturing method that are achieved by setting an area corresponding to the outermost peripheral area of the preset element formation area as the sparse pattern area have been explained in reference to the embodiments above, the present invention is not restricted to this example, and it may be adopted in masks and semiconductor device manufacturing methods that are achieved by setting any of various other areas such as an area where the pattern is isolated within the main pattern, an area within the preset element formation area where the pattern is sparse and an area within the main pattern where the pattern is relatively sparse.

Likewise, while the mask and the semiconductor device manufacturing method that are achieved by setting an area corresponding to the inner area of the preset element formation area as the densely patterned area have been explained in reference to the embodiments, the present invention is not restricted to this example, and it may be adopted in masks and semiconductor device manufacturing methods achieved by setting any of various other areas such as an area where the pattern is densely packed and an area where the pattern is relatively dense as the densely patterned area.

It is to be noted that in the present invention, an optimal type of resist may be selected for use by taking into consideration conditions such as the type of light source used and the resist pattern dimensions. Normally, such selection may be made from: photoresist, electron beam resist, positive and negative type resists.

According to the present invention, an additional pattern that is shifted or distorted is used to ensure that the wafer processing implemented before and after the lithography process is not adversely affected. In addition, according to the present invention, a simple and large additional pattern is utilized. Furthermore, according to the present invention, the additional pattern is formed at locations where the presence of an additional pattern is necessitated by optical requirements.

Thus, according to the present invention, the adjustment of the exposure quantity can be achieved in a simple, reliable and effective manner without adversely affecting other semiconductor manufacturing processes. As a result, according to the present invention, a reduction in characteristics defects of the semiconductor elements and an improved in the semiconductor device yield can be achieved.

In addition, according to the present invention, consistency in the resist pattern dimensions can be achieved without having to implement special processing such as, for instance, formation of a dummy element area on the wafer. Therefore, adoption of the present invention will simplify the overall process of semiconductor production and will improve the throughput.

The entire disclosure of Japanese Patent Application No. 11-42697 filed on Feb. 22, 1999 and No. 10-320630 filed on Nov. 11, 1998 including specifications, claims, drawings and summaries are in-corporated herein by reference in its entirety.

What is claimed is:

1. A mask employed in lithography, having drawn thereupon a main pattern with a plurality of pattern elements in a specific arrangement, the main pattern being transferred onto a preset element formation area on a wafer, and an additional pattern formed around and completely separated from, so as to not touch said main pattern of pattern elements to adjust the exposure quantity, wherein:
said additional pattern includes a shift pattern of additional pattern elements arranged with a specific staggering relative to said main pattern of pattern elements.

2. A mask according to claim 1, wherein:
said shift pattern conforms to an arrangement rule identical to the rule for said specific arrangement.

3. A mask according to claim 1, wherein:
intervals over which the additional pattern elements constituting said shift pattern are arranged and intervals over which the pattern elements constituting said main pattern are arranged are equal to each other.

4. A mask according to claim 1, wherein:
sizes of the additional pattern elements constituting said shift pattern and the pattern elements constituting said main pattern are equal to each other.

5. A mask according to claim 1, wherein:
shapes of the additional pattern elements constituting said shift pattern and the pattern elements constituting said main pattern are identical to each other.

6. A mask according to claim 1, comprising:
a glass plate; and
a chrome film provided on said glass plate with a main pattern having a plurality of pattern elements and an additional pattern surrounding and separated from the pattern elements, formed thereupon by partially removing said chrome film.

7. A mask employed in lithography, having drawn thereupon a main pattern with a plurality of pattern elements in a specific arrangement, the main pattern being transferred onto a preset element formation area on a wafer, and an additional pattern formed around and completely separated from, so as to not touch said main pattern of pattern elements to adjust the exposure quantity, wherein:
said additional pattern includes a frame pattern surrounding and completely separated from, so as to not touch said main pattern.

8. A mask according to claim 7, comprising:
a glass plate; and
a chrome film provided on said glass plate with said main pattern and said additional pattern formed thereupon by partially removing said chrome film.

9. A mask employed in lithography, having drawn thereupon at least a main pattern having a plurality of pattern elements in a specific arrangement, the main pattern being transferred onto a preset element formation area on a wafer, and an additional pattern surrounding the main pattern to adjust an exposure quantity through the mask, the additional pattern having a plurality of pattern elements of varying sizes.

10. A mask according to claim 9, comprising:
a glass plate; and
a chrome film provided on said glass plate with said main pattern and said additional pattern formed thereupon by partially removing said chrome film.

11. A method for manufacturing a semiconductor device that includes a lithography process during which a main pattern having a plurality of pattern elements drawn for a mask is transferred onto a preset element formation area on a wafer, wherein:
during said lithography process, an additional pattern that includes a shift pattern having additional pattern elements having a specific staggering relative to said main pattern and is drawn around and completely separated from, so as to not touch said pattern elements of the main pattern of said mask, is employed to adjust the exposure quantity.

12. A method for manufacturing a semiconductor device according to claim 11, wherein:
said additional pattern elements of the shift pattern conforms to an arrangement rule identical to a rule for the pattern elements of said main pattern.

13. A method for manufacturing a semiconductor device according to claim 11, wherein:
intervals over which the additional pattern elements constituting said shift pattern are arranged and intervals over which the pattern elements constituting said main pattern are arranged are equal to each other in said mask.

14. A method for manufacturing a semiconductor device according to claim 11, wherein:

shapes of the additional pattern elements constituting said shift pattern and the pattern elements constituting said main pattern are identical to each other in said mask.

15. A method for manufacturing a semiconductor device according to claim 11, wherein:

sizes of the additional pattern elements constituting said shift pattern and the pattern elements constituting said main pattern are equal to each other in said mask.

16. A method for manufacturing a semiconductor device that includes a lithography process during which a main pattern having a plurality of pattern elements drawn for a mask is transferred onto a preset element formation area on a wafer, wherein:

during said lithography process, an additional pattern that includes a frame pattern is drawn around and completely separated from, so as to not touch the pattern elements of said main pattern of said mask to adjust the exposure quantity.

17. A method for manufacturing a semiconductor device that includes a lithography process during which a main pattern having a plurality of pattern elements drawn for a mask is transferred onto a preset element formation area on a wafer, wherein:

during said lithography process, an additional pattern that is disposed in a peripheral area surrounding the main pattern of said mask is transferred onto the wafer around the present element formation area to adjust an exposure quantity through the mask, the additional pattern having a plurality of pattern elements of varying sizes.

18. A mask employed in lithography, comprising:

a main pattern for transfer onto a preset element formation area on a wafer, the main pattern having a matrix of main pattern elements that are disposed in parallel rows which are spaced apart by a first distance, the main pattern elements in the rows being aligned with main pattern elements in other rows; and an additional pattern disposed outside the matrix of main pattern elements to adjust an exposure quantity through the mask, the additional pattern comprising a row of additional pattern elements, the row of additional pattern elements being parallel to the rows of main pattern elements and being spaced apart from an outer row of the main pattern elements by a second distance, the second distance being different from the first distance.

19. A mask according to claim 18, wherein the additional pattern elements are aligned with the main pattern elements.

20. A mask according to claim 18, wherein the second distance is greater than the first distance.

21. A mask according to claim 18, wherein the main pattern elements and the additional pattern elements are all substantially the same size.

22. A mask according to claim 18, wherein the main pattern elements and the additional pattern elements comprise regions of metal film on a vitreous substrate.

23. A mask according to claim 22, wherein the metal is chrome and the vitreous substrate is glass.

* * * * *